United States Patent [19]
Lee et al.

[11] Patent Number: 5,321,285
[45] Date of Patent: Jun. 14, 1994

[54] CARRIER INJECTION DYNAMIC RANDOM ACCESS MEMORY HAVING STACKED DEPLETION REGION IN MESA

[75] Inventors: Ruojia Lee; Stanley N. Protigal, both of Boise, Id.

[73] Assignee: Micron Technology, Inc., Boise, Id.

[21] Appl. No.: 925,316

[22] Filed: Aug. 10, 1992

Related U.S. Application Data

[63] Continuation of Ser. No. 624,375, Dec. 7, 1990, abandoned, which is a continuation-in-part of Ser. No. 520,006, May 7, 1990, abandoned, and Ser. No. 522,004, May 7, 1990, abandoned.

[51] Int. Cl.$^5$ .................. H01L 29/68; G11C 11/34
[52] U.S. Cl. ........................... 257/296; 365/182
[58] Field of Search .............. 257/296, 313; 365/182

[56] References Cited

FOREIGN PATENT DOCUMENTS 8808617 11/1988 PCT Int'l Appl. ............... 257/194

*Primary Examiner*—Mark V. Prenty
*Attorney, Agent, or Firm*—Stanley N. Protigal

[57] ABSTRACT

A carrier injected dynamic random access memory is defined. A depletion region adjacent to a source/drain region of a transistor is used as a storage cell in a memory array, and logic levels may then be measured by sensing the conductive portion. A low logic level is stored by a reduced formation of the depletion adjacent the conductive portion. These logic levels are sensed and periodically refreshed by conduction through the access device. The logic levels may be read by measuring potential through the access device, or by measuring punch through voltage between the source/drain region and a nearby conductive region. As the level of injected carriers increases, the punch through also increases. A punch through results in a readable increase in current through the access device, thereby providing an indicia of a in logic level.

6 Claims, 6 Drawing Sheets

CARRIER INJECTION DYNAMIC RANDOM ACCESS MEMORY HAVING STACKED DEPLETION REGION IN MESA

CROSS REFERENCE TO RELATED APPLICATION

This application is a continuation of U.S. patent application Ser. No. 07/624,375 filed Dec. 7, 1990 and now abandoned, which is a continuation-in-part of U.S. patent application Ser. No. 07/520,006 filed May 7, 1990, now abandoned, and U.S. patent application Ser. No. 07/522,004 filed May 7, 1990, now abandoned.

FIELD OF THE INVENTION

This invention relates to semiconductor memory cells, such as memory cells in a semiconductor random access memory (RAM) array. More specifically the invention relates to the storage of a memory logic level in a memory cell which is refreshed or periodically refreshed and which is addressed through address circuitry for the purpose of reading and writing the logic levels in a plurality of cells on a semiconductor integrated circuit. The type of memory storage is referred to as dynamic random access memory because, in the preferred embodiment, the memory is stored in a manner which requires periodic refresh. This type of storage is referred to as "active storage".

Rather than storing and maintaining a charge within a memory cell capacitor to represent a binary value, as is the conventional practice, the present invention relies on the establishment and maintenance of a depletion depth region for the representation of a binary value.

BACKGROUND OF THE INVENTION

The invention uses various materials which are electrically either conductive, insulating or semiconducting, although the completed semiconductor circuit device itself is usually referred to as a "semiconductor". The invention refers to a method of controlling addressed devices, and is not restricted to implementations which involve memory devices or semiconductor devices.

An electronic circuit is chemically and physically integrated into a substrate such as a silicon wafer by patterning regions in the substrate, and by patterning layers on the substrate. These regions and layers can be conductive, for conductor and resistor fabrication. They can also be of differing conductivity types, which is essential for transistor and diode fabrication. Degrees of resistance, capacitance, or conductivity are controllable, as are the physical dimensions and locations of the patterned regions and layers, making circuit integration possible.

In this disclosure, "n type material" denotes silicon that has been doped with atoms having more than four valence electrons (group V or higher), such as arsenic or phosphorous which introduce negatively charged majority carriers into the silicon, and "p type material" denotes silicon doped with atoms having less than four valence electrons (group III or lower), such as boron, which introduce positively charged majority carriers. The majority charge carrier type is also referred to as conductivity type. A plus or minus superscript on an n or p indicates heavy or light doping, respectively. "Poly" denotes polycrystalline silicon.

In a dynamic random access memory (DRAM), a plurality of cells consisting of capacitors are each connected to respective access devices. The access device is usually a field effect transistor, and is used to conduct current between the capacitor and address circuitry, in order to charge the capacitor to a logic level and to read that charge.

The memory cells of dynamic random access memories are comprised of two main components: a field-effect transistor (FET) and a capacitor. In DRAM cells utilizing a conventional planar capacitor, far more chip surface area is dedicated to the planar capacitor than to the field-effect transistor. The gate of the FET and an interconnect word line are formed from an etched polycrystalline silicon layer. The FET has source and gate connections to bit line and word line connections. The capacitor has a lower plate formed from an n+ silicon substrate. The upper capacitor plate is formed from a layer of polycrystalline silicon, and is electrically insulated from upper plate by a dielectric layer.

Planar capacitors have generally proven adequate for use in DRAM chips up to the one-megabit level, but appear to be unusable beyond the one-megabit DRAM level when constructed with conventional dielectric materials. As component density in memory chips has increased, the shrinkage of cell capacitor size has resulted in a number of problems. Firstly, the alpha-particle component of normal background radiation will generate hole-electron pairs in the n+ silicon substrate plate of a cell capacitor. This phenomena will cause the charge within the affected cell capacitor to rapidly dissipate, resulting in a "soft" error. Secondly, the sense-amp differential signal is reduced. This aggravates noise sensitivity and makes it more difficult to design a sense-amp having appropriate signal selectivity. Thirdly, as cell capacitor size is decreased, the cell refresh time must generally be shortened, thus requiring more frequent interruptions for refresh overhead. The difficult goal of a DRAM designer is therefore to increase or, at least, maintain cell capacitance as cell size shrinks, without resorting to processes that reduce product yield or that markedly increase the number of masking and deposition steps in the production process.

Several methods for providing adequate cell capacitance in the face of shrinking cell size are either in use or under investigation. Basically, the efforts fall into two categories. Efforts within the first category are aimed at creating complex three-dimensional capacitors; those within the second are aimed at improving the dielectric of the planar capacitor.

The three-dimensional technique currently receiving the most attention involves the creation of "trench" capacitors in the cell substrate. The trench is employed to provide greater plate area, and hence, greater capacitance. The lower plate and upper plates are still insulated with a dielectric layer, but these layers are arranged vertically, when viewed in cross section with the substrate horizontal. DRAM chips employing trench capacitors have been built by a number of European, Japanese and U.S. companies, including Texas Instruments Inc., Nippon Electric Company, Toshiba, Matsuchita and Mitsubishi Electric Corporation. There are several problems inherent in the trench design, not the least of which is trench-to-trench capacitive charge leakage which is the result of a parasitic transistor effect between trenches. Another problem is the difficulty of completely cleaning the capacitor trenches during the fabrication process; failure to completely clean a trench will generally result in a defective cell.

Another three-dimensional technique, which is being used by Mitsubishi Electric Company, Hitachi, and Fujitsu Ltd., is the stacking of capacitor plates between dielectric layers on the DRAM cell surface. Both the lower plate and the upper plate are made from n-type polycrystalline silicon layers and are separated by a dielectric layer and arranged in a high-profile cell which requires more stringent process control for the connection of bit line to FET source. The capacitor thus formed also fails to use the n+ silicon substrate extension of FET drain as a plate of capacitor.

Alternatively, other schemes involve the use of ferroelectric materials for DRAM cell capacitor dielectrics. Since ferroelectric materials have a dielectric constant more than 100 times that of silicon oxides, the use of such materials has the potential for allowing the size of the DRAM-cell capacitor to be shrunk to one of the smaller cell elements without resorting to three-dimensional structures. Critics of ferroelectric materials point out that such materials suffer from a "wearout" mechanism. In addition, they warn that there are many chemical incompatibilities with the other materials used in integrated circuit fabrication and that the layering of ferroelectric films within integrated circuit structures has not yet been done successfully.

Since the capacitor is very small on a high density DRAM, the cell must be frequently refreshed. This is done by reading the stored logic level in that cell before the logic level is lost through leakage current, followed by rewriting the same value into the cell.

The capacitors consist of conductors separated by dielectric material. The capacitor, despite its small size, must therefore maintain a significant surface area of these conductors and dielectric material in order to store enough charge to provide enough potential and current to be read. Of course, larger capacitors consume more current when charged. It would therefore be advantageous to provide a dynamic random access memory which does not require the use of capacitors for storage of memory logic levels.

In the operation of a field effect transistor, such as a MOSFET, an electrical charge on an electron gate is used to induce a change in electric charge carriers in a semiconductor material, beneath the gate, between source and drain regions. This change changes the conductive status of the semiconductor material beneath the gate. In that manner, an electric potential applied to the gate can modulate current flow across the semiconductor beneath the gate, between the source and drain.

The application of potential to a portion of a semiconductor creates depletion depth region, which is essentially a "hot zone" of injected depletions surrounding that portion of the semiconductor which is charged to the potential.

It is possible to use such a depletion region of a semiconductor as a storage cell in a memory array. The depletion region is charged through a conductive region, such as a source/drain area of a transistor. When the depletion region is used in this manner, logic levels may then be measured by sensing the conductive region.

A high logic level is stored by the formation of the depletion region by causing the region under the conductive portion to be injected with carriers which are injected by a charge potential at the conductive portion. A low logic level is stored by a reduced formation of the depletion under the conductive portion. These logic levels are sensed and periodically refreshed by conduction through the access device.

In an initial concept, the depletion region was located in a semiconductor substrate below source/drain areas of transistors. The source/drain areas were also implanted into the substrate. A doped substrata was located subjacent the depletion region. When a charge is applied to the substrata, current would pass to the source/drain areas if the depletion region is not already charged. This results in an increased voltage level in the cell if the cell had previously had a reduced charge. The preferred location for the substrata was within the substrate, which means that addressing of portions of an array is difficult. This also means that a large portion of the semiconductor device must be brought to an elevated voltage. The formation of the substrata was accomplished by increasing the depth of an implant (such as phosphorous implant) under or through an active area, so that the dopant density profile ("dopant density") peaks are significantly separate in depth, preferably 0.6 microns or more.

In that configuration the depletion layer is located between an area of a substrate which is rendered conductive by doping and a substrata consisting of a doped level below the surface of a substrate. The storage cell is read by measuring potential through the access device, or by measuring punch through voltage between the substrata and the access device. As the level of injected carriers increases, the punch through also increases. A punch through results in a readable increase in current through the access device, thereby providing an indicia of a change in logic level.

The reading of storage cells by causing a punch through to occur means that the read operation will reverse the charge of the cell. Therefore, all cells which are subjected to the charge across the depletion area must be refreshed, or the inversion of the logic levels be otherwise accounted for.

One modification included differentially doping source/drain regions of the access device. This reduces the depletion region on an address line side of the access device and increase the depletion region on the opposite side of the access device, where the injected carriers corresponding to logic levels were stored.

SUMMARY OF THE INVENTION

In accordance with the present invention, a depletion region adjacent to a primary conductive portion of a semiconductor circuit device is used as a storage cell in a memory array. An opposition region of conductive material is placed adjacent the depletion region, so that the opposition region and the primary conductive region are separated by the depletion.

The opposition region is arranged near or above the surface of a semiconductor substrate in order that the opposition region may be directly addressed without passing address signals through a substrata. This may be accomplished by SEG (Selective Epitaxy Growth).

In one embodiment of the invention, transistor gates and the depletion region are formed of a first layer of deposited silicon such as amorphous silicon or polysilicon (poly). A second layer of conductive material, such as a second layer of deposited silicon, is used to form the opposition region. The depletion region is in electrical communication with a source/drain area of a transistor, so that a first layer of deposited silicon can form both gate and depletion regions, at different locations. It is possible to form the second layer of conductive material from the same layer of deposited silicon used to form transistor gates. The depletion layer could then be substrate material, or differently doped deposited silicon between the transistor gates and the second layer of conductive material.

In one embodiment of the invention, the conductive portion which is sensed is a source/drain region of an n channel transistor. In order to enhance the formation of the depletion region, the second layer of conductive materials is an n type layer of deposited silicon doped to exhibit an excess of mobile hole concentration is located below the depletion region.

A high logic level is stored by the formation of the depletion region by causing the region between the conductive portions to be injected with carriers which are injected by a charge potential at the primary conductive portion. A low logic level is stored by a reduced formation of the depletion under the conductive portion. These logic levels are sensed and periodically refreshed by conduction through the access device.

The storage cell is provided as a depletion layer formed by carrier injected electrons. This depletion layer is located between an area of a semiconductor which is rendered conductive by doping and the opposition region, preferably consisting of a doped deposited semiconductor layer.

The inventive storage cell may be read by measuring potential through the access device, or by measuring punch through voltage between the opposition region and the primary conductive portion. As the level of injected carriers increases, the punch through also increases. A punch through results in a readable increase in current through the access device, thereby providing an indicia of a change in logic level.

BRIEF DESCRIPTION OF THE DRAWINGS

FIG. 4 shows a low logic state and FIG. 5 shows a high logic state;

FIGS. 6 and 6a shows a low logic state and FIG. 7 shows a high logic state;

DETAILED DESCRIPTION OF THE PREFERRED EMBODIMENTS

Figure 1:
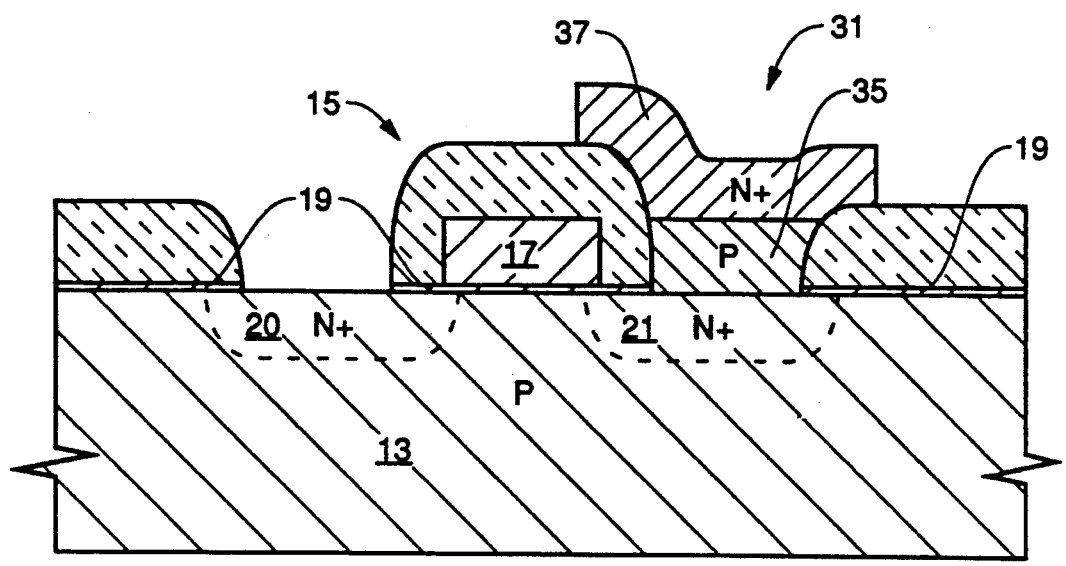
FIG. 1 shows a cross sectional view of a semiconductor substrate containing inventive carrier injected dynamic random access memory cell.

FIG. 1 shows a cross section of a silicon semiconductor wafer showing a substrate 13 with a transistor 15. The transistor 15 includes a gate electrode 17 and source/drain areas 20, 21. The gate electrode 17 is isolated from the substrate 13 by a thin layer of dielectric 19, referred to as gate oxide, whereas the source/drain areas 20, 21 consist of doped areas of the substrate 13. As is conventional, the transistor 15 functions by a potential applied to the gate electrode 17 changing an amount of minority carriers in the substrate 13 beneath the gate electrode 17, and thereby controlling conductivity of the substrate 13 between the source/drain areas 20, 21.

The gate electrode 17 is formed of a conductor, which is typically deposited silicon, doped to be conductive. In conventional processes, where the gate electrode 17 is deposited separately, the gate electrode 17 is doped polysilicon, although other conductive materials or semiconductors also can be used as the gate. Since there is little current flow through the gate electrode 17, the gate electrode 17 may be fairly resistive.

A second region of deposited silicon 31 is located above source/drain area 21, so that the second region of deposited silicon 31 is in electrical communication with source/drain area 21. The second region 31 comprises an intermediate region 35 and an opposition region 37. The opposition region 37 is located apart from source/drain area 21, so that the intermediate region 35 is located between source drain area 21 and opposition region 37.

The intermediate region 35 and opposition region 37 may be formed simultaneous with the gate electrode 17, or may be formed as separate layers of deposited silicon. There is an advantage in forming the second region 31 in separate deposition steps, in that it is possible to provide the most advantageous molecular structure of both the intermediate region 35 and the opposition region 37. Separate deposition of the opposition region 37 also permits forming a distinct boundary between the opposition region 37 and the intermediate region 35.

The opposition region 37 is preferably formed by an opposite conductivity type material as that of the intermediate region 35. In order to form the opposition region 37, minority carriers are increased by the use of a dopant, preferably during the deposition of the opposition region. In the preferred embodiment, the substrate 13 is formed from a silicon wafer and is preferably p type material. The doped regions 20, 21, 37 are n type material.

If the transistor 15 is a depletion mode n channel transistor, the substrate 13 is p type material and a positive charge of the gate electrode 17 results in an increase in electron "holes" between source/drain areas 20, 21. If source/drain area 20 has a low potential applied to it, then source/drain area 21 will remain at approximately the same low potential, plus an increase in potential which is primarily due to leakage current. On the other hand, if source/drain area 20 has a high potential applied to it, then source/drain area 21 will increase in potential correspondingly.

Figure 2:
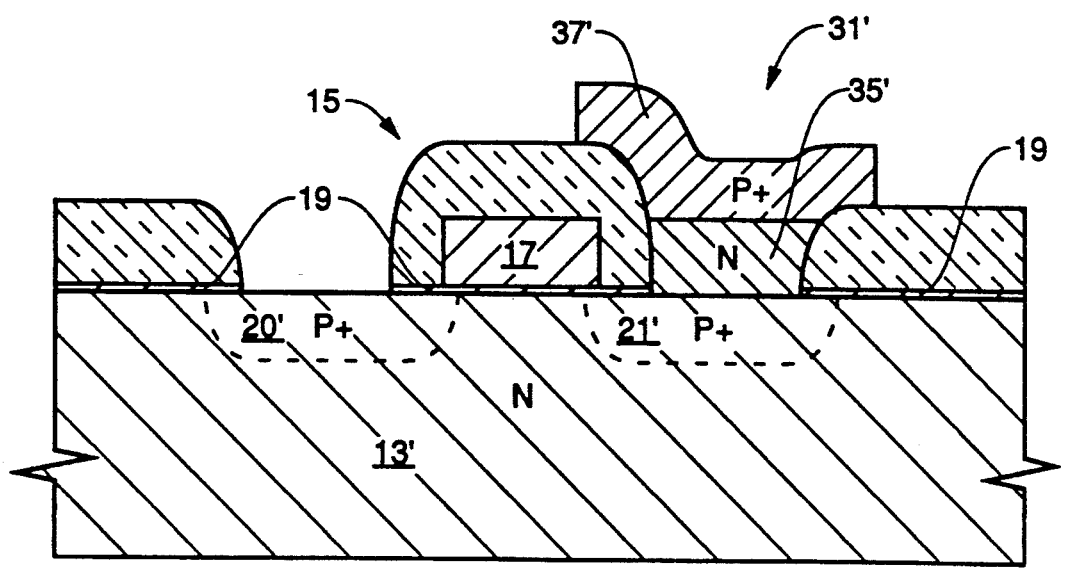
FIG. 2 shows a cross sectional view of a semiconductor in which an n type intermediate region is used.

As shown in FIG. 2, if the substrate is n type material, then the source/drain areas 20', 21' and the opposition region 37' would be would be p type material. The intermediate region 35' would be n type.

When the potentials are applied to the source/drain areas 20, 21, the intermediate region 35 is injected with minority carriers. This is caused by the potential of source/drain area 21, being applied to regions near the source/drain area 21. This phenomenon is usually ignored or the effects of it are avoided. In the present invention, however, the carrier injection phenomenon is used as a means to store a memory logic level. The logic level is determined by a charge level of minority carriers, which corresponds to a potential at the source/drain area 21 which is isolated by the transistor channel (that portion of the substrate under the transistor gate electrode 17).

It turns out that the potential at the source/drain area 21 is difficult to measure because the amount of energy stored in the intermediate area 35 as a result of carrier injection is relatively small, as compared to the amount of energy which may be absorbed by address lines and sense amps. In other words, the stored logic level may be measured by measuring a potential at the transistor 15, but this may be difficult because the energy represented by the minority carriers is low. For this reason, an electrical effect of the injected carriers is used to detect the presence of the carriers.

Potential conducted to the opposition region 37 is used to generate the electrical effect, referred to as the punch through phenomenon.

The invention was conceived as using a p type substrate 13, with an n channel transistor 15 which has source/drain areas 20, 21 counterdoped as n type material and the opposition region 37 being defined by counterdoping as n type material. It is also possible to create a similar structure by different techniques, such as by using an n type starting wafer.

Figure 3:
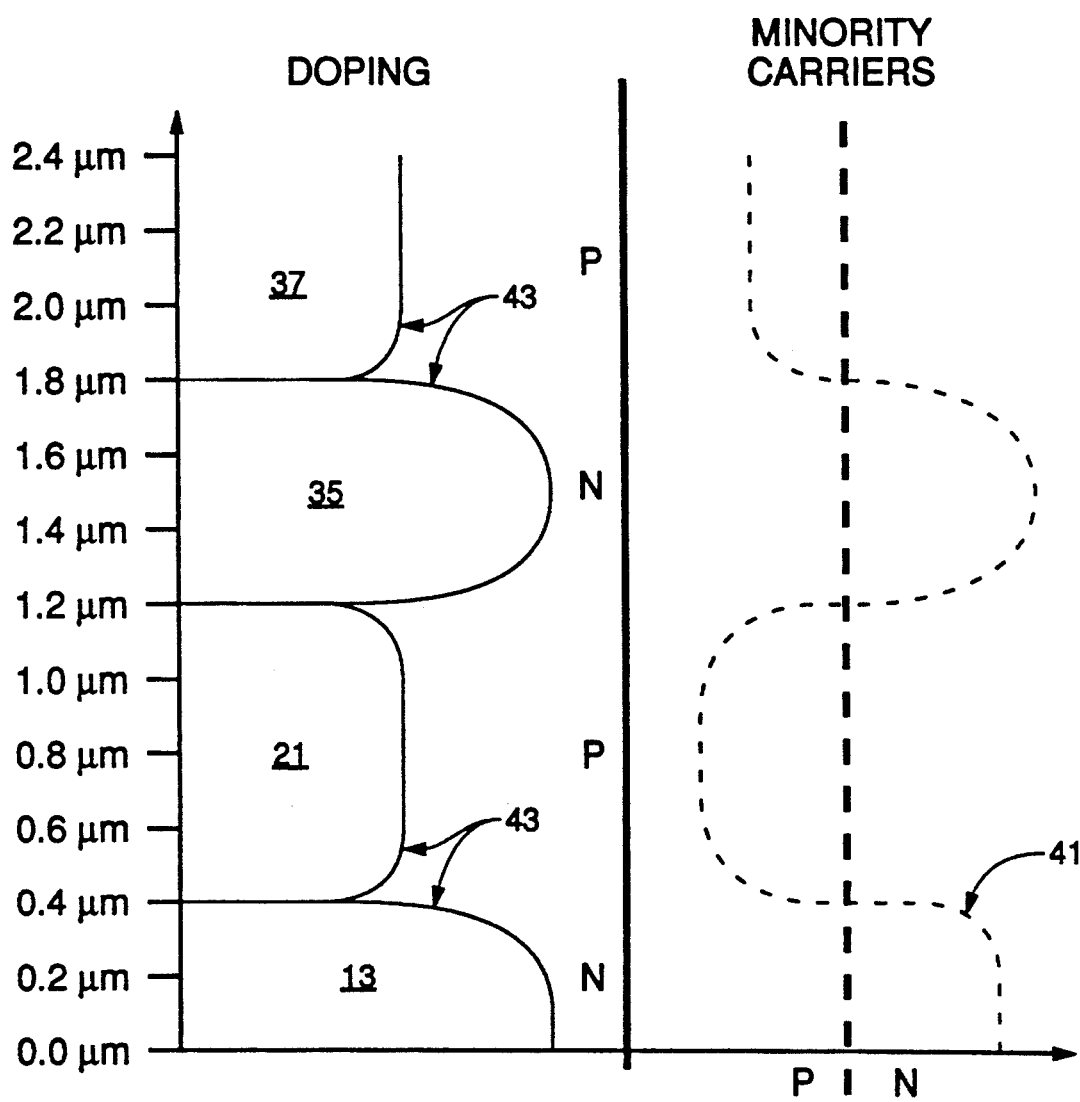
FIG. 3 illustrates a dopant density profile of an implant.

Referring to curve 41 in FIG. 3, the intermediate region 35, as indicated at curve 43 is doped opposite to the source/drain area 21. The concentration of the minority carriers in the opposition region 37 is represented at 47, where the second region 31 is doped to the same conductivity type as the source/drain area 21. This results in the conductivity type profile of curve 41, in which two like conductivity types are separated by an opposite conductivity type.

Figure 4:
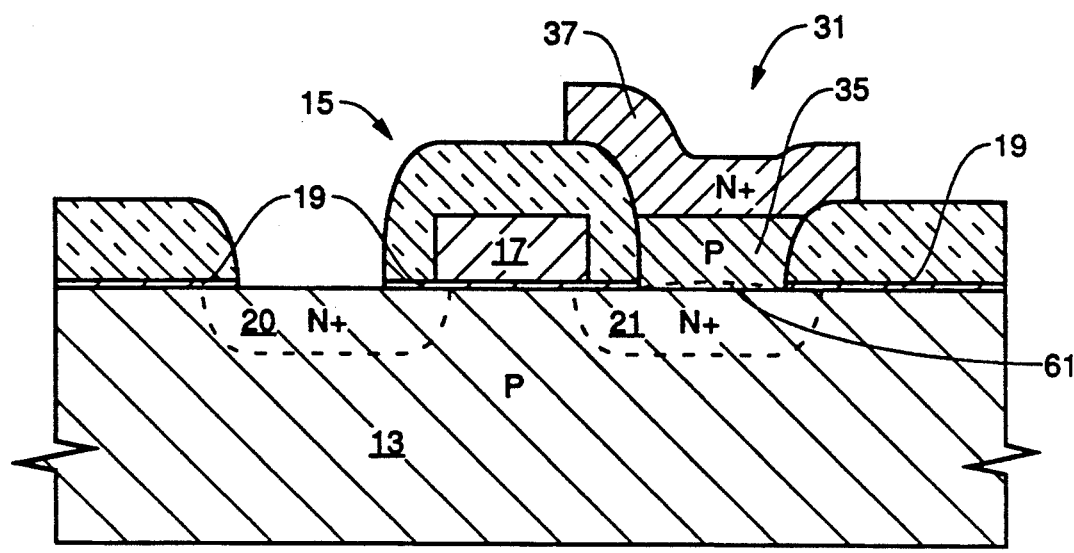
FIGS. 4 and 5 show a configuration of the inventive carrier injected dynamic random access memory cell in WRITE modes.
Figure 5:
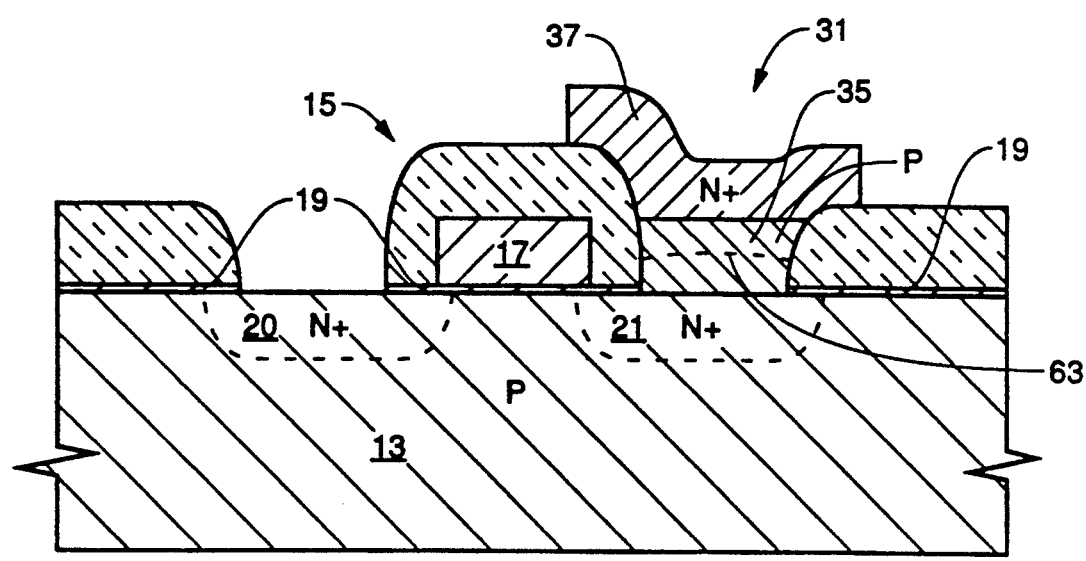

FIGS. 4 and 5 depict the electrical effects of the injection of minority carriers into the intermediate region 35 from source/drain area 21. Referring to FIGS. 4 and 5, a WRITE operation is achieved by gating the transistor 15 by applying potential to the gate electrode 17. If the logic level to be written is low, then source/drain area 20 has a low potential applied to it. This results in the low potential being conducted to source/drain area 21, and a minimized depletion region forming under source/drain area 21, as represented by dashed line 61. (It may be that no depletion region is formed under source/drain area 21 under these conditions.) If the logic level to be written is high, then source/drain area 20 has a high potential applied to it. This results in the high potential being conducted to source/drain area 21, and a significant depletion region forming under source/drain area 21, as represented by dashed line 63.

An example of a low potential is 0 volts and an example of a high potential is 5 volts.

There is no dielectric isolation to separate the depletion region 61 or 63 from source/drain 21 or the opposition region 37. The high logic level depletion region 63 will rapidly dissipate, and leakage current will rapidly increase a low logic level depletion region 61. Therefore, it is necessary to frequently refresh the logic level values represented by the depletion regions 61, 63.

Figure 6:
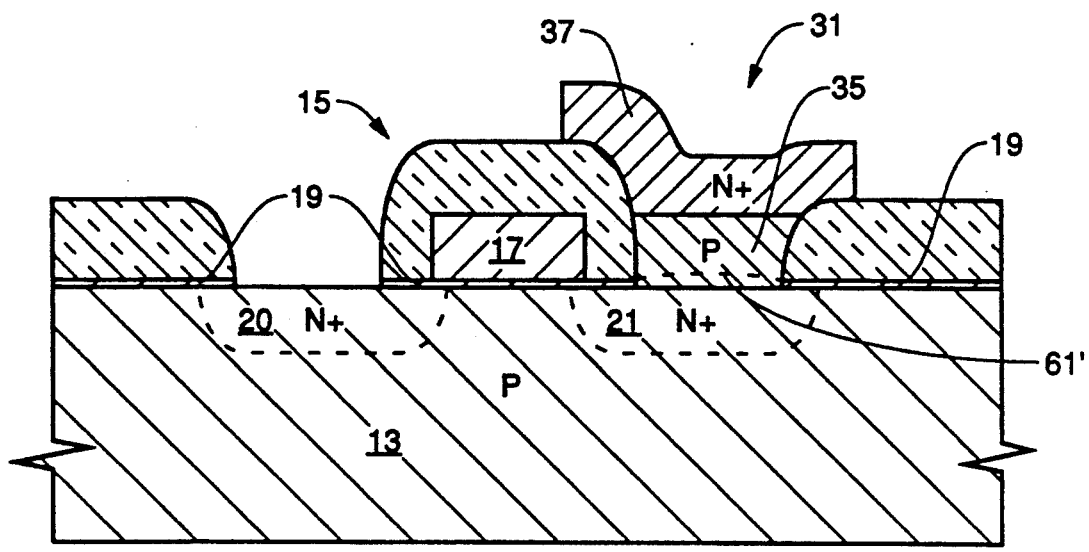
FIGS. 6, 6a and 7 show the configuration of FIGS. 4 and 5 during READ modes.
Figure 6A:
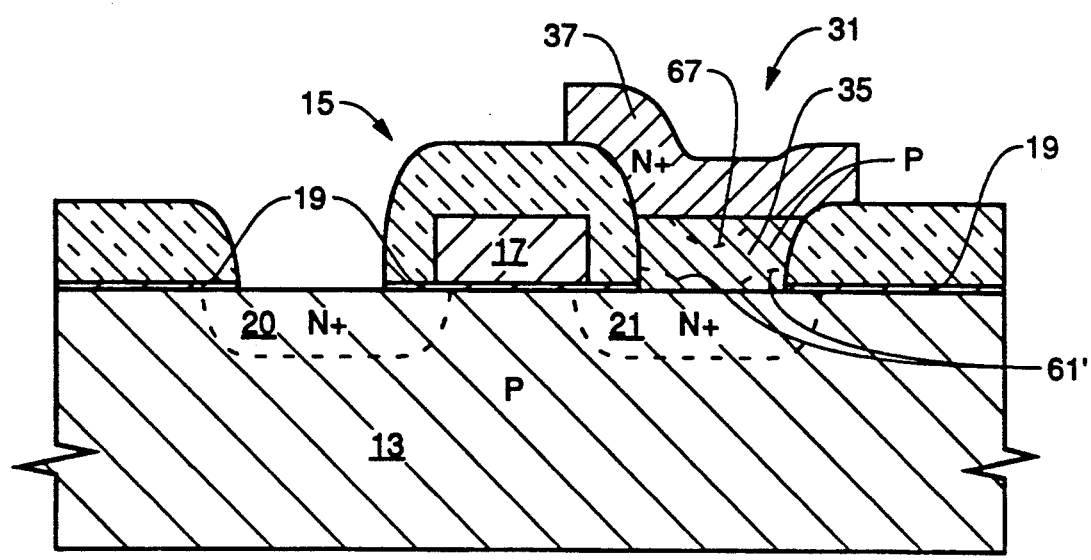
Figure 7:
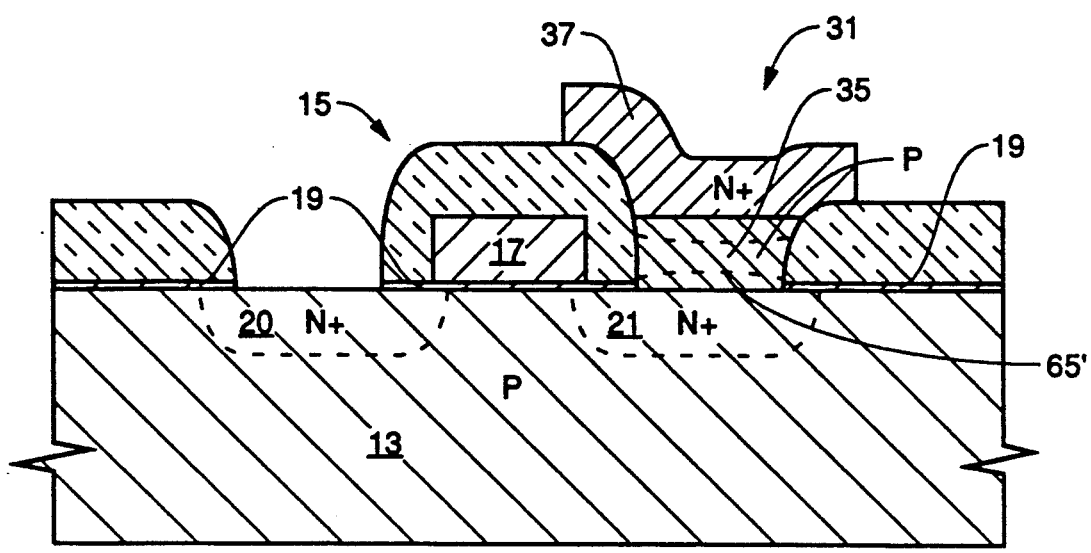

Referring to FIGS. 6 and 7, a READ operation is also achieved by gating the transistor 15 by applying potential to the gate electrode 17. Whether the logic level to be written is low or high, as represented by depletion region 61' (FIGS. 6 and 6a) of depletion region 65' (FIG. 7), then source/drain area 21 would ordinarily be expected to only be storing an insignificant amount of energy. Consequently area 21 would transfer very little current to source/drain area 20. That would result in a low potential being conducted to source/drain area 20, regardless of the stored logic level.

If the opposition region 37 is charged to a high potential, then this creates a depletion layer of minority carriers, represented by dotted lines 61' and 65' (FIGS. 6 and 7). This depletion layer extends in the direction of source/drain region 21. If the depletion layer caused by source drain region 21 being charged is great enough, then this creates a charge opposition to the depletion layer caused by charging the opposition region 37.

On the other hand, if the depletion layer caused by source drain region 21 being charged is low, then this reduces charge opposition to the depletion layer caused by charging the opposition region 37. Without the charge opposition, the potential at the opposition region 37 will "punch through" to source/drain region 21, as represented in FIG. 6a, at line 67.

The distance between the opposition region 37 and source/drain area 21 is such that the maximum depletion region 63 desired storage of a high level charge clears the opposition region 37, but a predetermined potential applied to the opposition region 37 will punch through to source/drain area 21 in the absence of an unambiguously high stored level 63' at source/drain area 21.

FIG. 6a therefore shows a READ operation in which a low level charge is extant at source/drain region 21. In this situation, if the transistor 15 is gated ON, the punch through current will be read by the sense amp, as shown symbolically in FIG. 6a. In this manner, a low stored level 61' will permit the charge 67 at the opposition region 37 to "punch through" to source/drain area 21.

FIG. 7 shows a READ operation in which a high level charge is stored at source/drain region 21. If there is no punch through current, then the sense amp will read a low level of current. In this manner, a high stored level 65' will prevent the charge at the opposition region 37 from reaching the source/drain area 21. Thus, a READ of a high level charge will result in a low output from the transistor 15.

All of this requires that the opposition region 37 and the gate electrode 17 have timed signals applied. Proper timing would be timing which would cause the punch through phenomenon to occur at precisely the time which the transistor 15 is gated ON. The actual timing would be close to synchronism of application of potential to the opposition region 37 and the transistor gate electrode 17. If the particular design of the address circuitry is such that gating the transistor 15 would substantially change the charge of source/drain area 21, then it may be necessary to stagger the application of potential to the opposition region 37 and the gate electrode 17, so that punch through can occur before gating of the transistor 15. In any case, addressing techniques are well known and depend on the specific layout of an array of cells such as transistor 15.

From the above, it is clear that the opposition region 37 is a part of the address scheme. Indeed, if more than one transistor is charged to a high logic level, the opposition region 37 may effect a punch through to those other transistors. This may have the effect of recharging the depletion regions 63, or may result in ambiguous readings. The location of the opposition region 37 above the substrate 13 makes it possible to selectively charge the opposition regions 37 above one or more cells.

Figure 9:
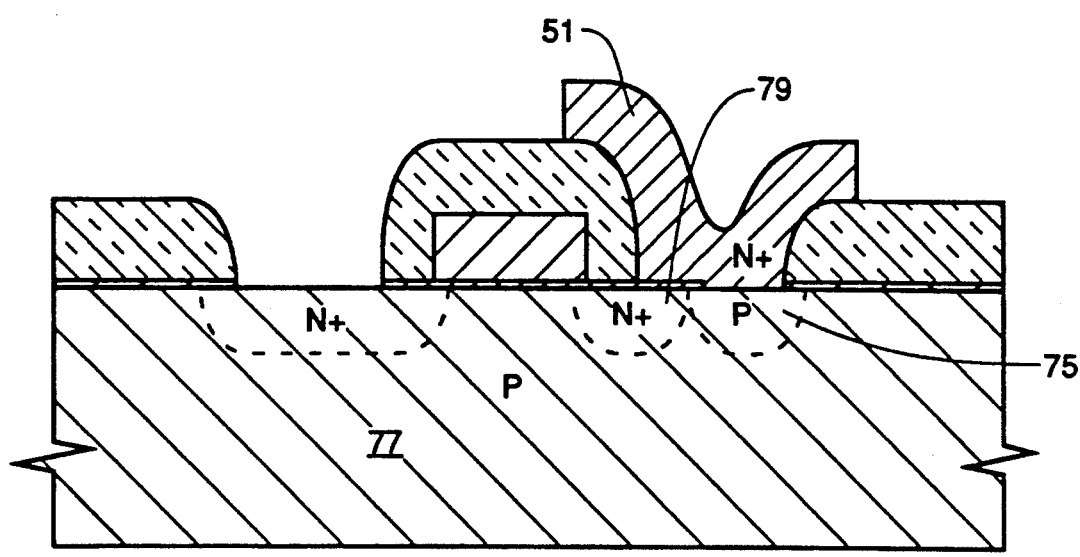
FIG. 9 shows an alternate structure of a carrier injected dynamic random access memory cell.
Figure 8:
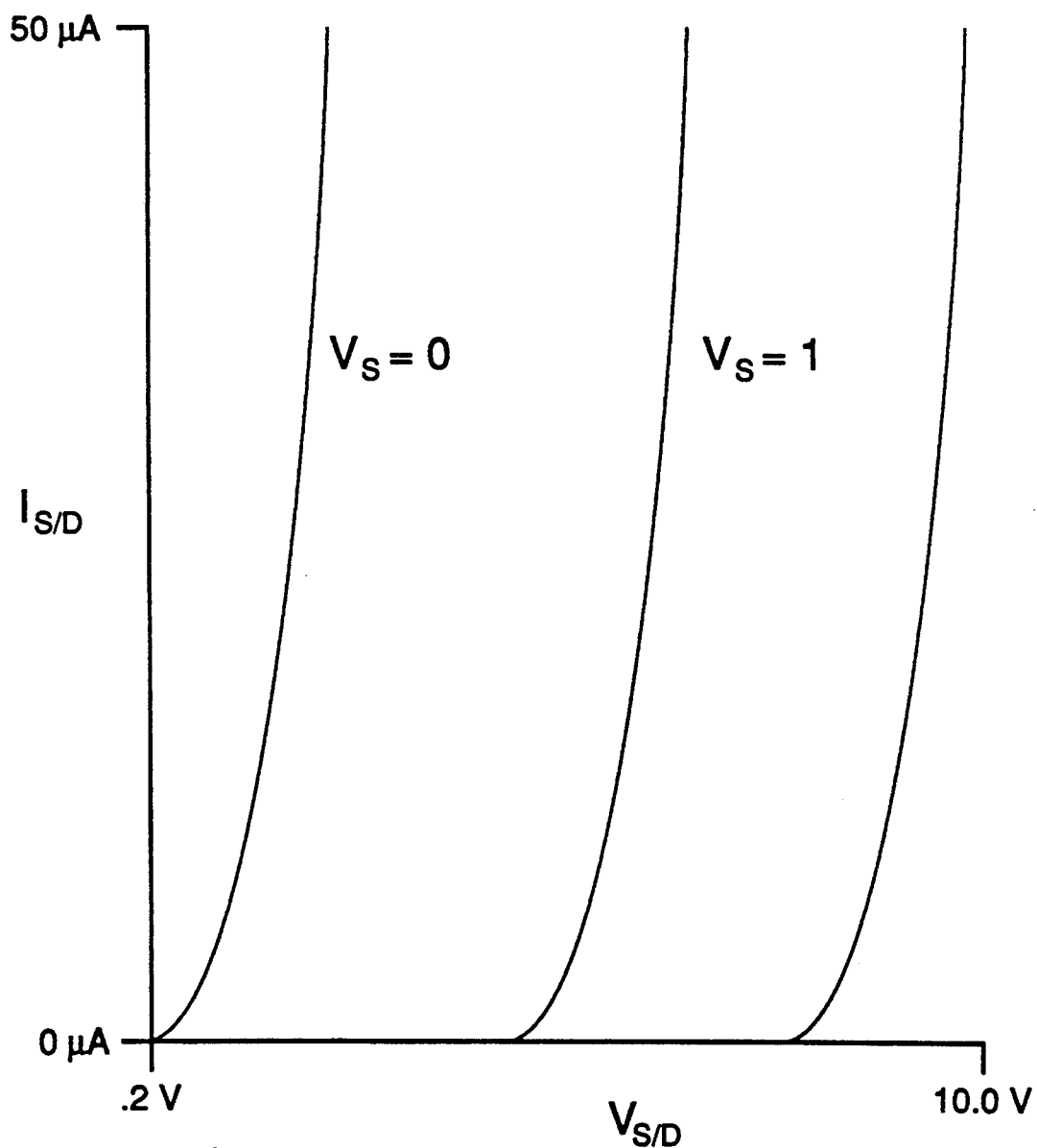
FIG. 8 shows an anticipated response of the inventive carrier injected storage cell.

FIG. 8 shows an anticipated response of the inventive carrier injected storage cell. Since we tested the concept on a conventional DRAM cell, the precise response cannot be ascertained. In FIG. 9, the sensed current is indicated as $V_{S/D}$.

FIG. 9 shows a configuration in which an intermediate region 75 is a portion of the substrate 77. Therefore, a source/drain area 79 extends to the intermediate region 75. An opposition region 51 may be either deposited conductive material as shown, or a doped region of the substrate 77. When the potentials are applied source/drain area 79, the substrate 77 is injected with minority carriers near the source/drain area 77. This phenomenon results in the injection of minority carriers in the intermediate region 75 between the source/drain area 79 and the opposition region 51.

The results of READ and WRITE operations would be the same as that described in connection with the configuration of FIG. 1.

Clearly, the above description is of specific embodiments of the invention. It is possible to use the inventive concepts for circuits other than dynamic random access memory arrays. For example, a register would be able to store two or more logic levels. Additional logic levels may be obtained by using multiple sources for punch through depletion charges 67. It is also possible to cause the invention to function with different physical arrangements of the components, such as non-buried sources of punch through depletion charges. It is also possible to arrange punch through layers as layers superimposed over the transistor. Accordingly, the invention should be read as limited only by the appended claims.

We claim:

1. Semiconductor apparatus comprising:
   a) a semiconductor substrate;
   b) a first conductive region;
   c) means to selectively charge said first conductive region to one of at least two potential values, said potential values representing high and low logic states;
   d) a second conductive region deposited over said semiconductor substrate;
   e) an intermediate region separating the first conductive region from the second conductive region, wherein a depletion region can be formed between the first and second conductive regions by applying a potential to the first conductive region;
   f) means to address the first conductive region so as to read and write logic states, the logic states corresponding to the potential values applied to said first conductive region.

2. The semiconductor apparatus of claim 1, wherein:
   the intermediate region being deposited on the semiconductor substrate prior to deposition of the second conductive region.

3. The semiconductor apparatus of claim 1, wherein:
   the intermediate region being deposited on the semiconductor substrate subsequent to forming the first conductive region.

4. The semiconductor apparatus of claim 1, wherein:
   the intermediate region being deposited on the semiconductor substrate.

5. The semiconductor apparatus of claim 4, wherein:
   the first conductive region includes a source/drain area of a transistor.

6. The semiconductor apparatus of claim 1, wherein:
   the first conductive region includes a source/drain area of a transistor.

* * * * *